(12) United States Patent
Shatalov et al.

(10) Patent No.: US 8,426,225 B2
(45) Date of Patent: Apr. 23, 2013

(54) SEMICONDUCTOR MATERIAL DOPING BASED ON TARGET VALENCE BAND DISCONTINUITY

(75) Inventors: Maxim S. Shatalov, Columbia, SC (US); Remigijus Gaska, Columbia, SC (US); Jinwei Yang, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 228 days.

(21) Appl. No.: 12/960,476

(22) Filed: Dec. 4, 2010

(65) Prior Publication Data

US 2011/0138341 A1 Jun. 9, 2011

Related U.S. Application Data

(60) Provisional application No. 61/266,523, filed on Dec. 4, 2009.

(51) Int. Cl.
*H01L 29/06* (2006.01)
*H01L 31/072* (2012.01)
*H01L 31/109* (2006.01)
*H01L 31/0328* (2006.01)
*H01L 31/0336* (2006.01)

(52) U.S. Cl.
USPC ............... 438/22; 438/37; 438/43; 257/13; 257/15

(58) Field of Classification Search ............. 438/22, 438/37; 257/13, 15, E33.005
See application file for complete search history.

(56) References Cited

U.S. PATENT DOCUMENTS

| | | | | | |
|---|---|---|---|---|---|
| 4,705,361 | A | * | 11/1987 | Frazier et al. | 359/263 |
| 5,047,810 | A | * | 9/1991 | Chemla et al. | 257/25 |
| 5,521,742 | A | * | 5/1996 | Ishimura | 359/248 |
| 5,686,734 | A | | 11/1997 | Hamakawa et al. | |
| 7,619,238 | B2 | * | 11/2009 | Gaska et al. | 257/14 |

OTHER PUBLICATIONS

PCT, Notification of Transmittal of the International Search Report and the Written Opinion of the International Searching Authority, or the Declaration, Date of Mailing Jul. 29, 2011, 9 pages.

(Continued)

*Primary Examiner* — Phuc Dang
(74) *Attorney, Agent, or Firm* — LaBatt, LLC (57) ABSTRACT

A solution for designing and/or fabricating a structure including a quantum well and an adjacent barrier is provided. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. The quantum well and the adjacent barrier can be formed such that the actual band discontinuity corresponds to the target band discontinuity.

20 Claims, 7 Drawing Sheets

OTHER PUBLICATIONS

Hang et al., AlxGa1-xN/GaN band offsets determined by deep-level emission, Journal of Applied Physics, vol. 90, No. 4, Aug. 15, 2001, pp. 1887-1890.

Nakano et al., "Electrical Properties of Acceptor Levels in Mg-Doped GaN", Phys. Stat. Sol. (c) 0, No. 1, pp. 438-442, Copyright 2002.

Shur et al., "Accumulation Hole Layer in p-GaN/AlGaN Heterostructures", Applied Physics Letters, vol. 76, No. 21, pp. 3061-3063, May 22, 2000.

Kozodoy et al., "Enhanced Mg Doping Efficiency in Al(0.2)Ga(0.8)N/GaN Superlattices", Applied Physics Letters, vol. 74, No. 24, pp. 3681-3683, Jun. 14, 1999.

Kozodoy et al., "Polarization-enhanced Mg Doping of AlGaN/GaN Superlattices", Applied Physics Letters, vol. 75, No. 16, pp. 2444-2446, Oct. 18, 1999.

Saxler et al., "Aluminum Gallium Nitride Short-Period Superlattices Doped with Magnesium", Applied Physics Letters, vol. 74, No. 14, pp. 2023-2025, Apr. 5, 1999.

Schubert et al., "Enhancement of Deep Acceptor Activation in Semiconductors by Superlattice Doping", Applied Physics Letters, vol. 69, No. 24, pp. 3737-3739, Dec. 9, 1996.

\* cited by examiner

SEMICONDUCTOR MATERIAL DOPING BASED ON TARGET VALENCE BAND DISCONTINUITY

REFERENCE TO PRIOR APPLICATIONS

The current application claims the benefit of U.S. Provisional Application No. 61/266,523, titled "Method of Doping and Semiconductor Devices", which was filed on 4 Dec. 2009, and which is hereby incorporated by reference.

TECHNICAL FIELD

The disclosure relates generally to semiconductor device fabrication, and more particularly, to the design and fabrication of a structure including a set of quantum wells and a set of barriers.

BACKGROUND ART

Figure 1:
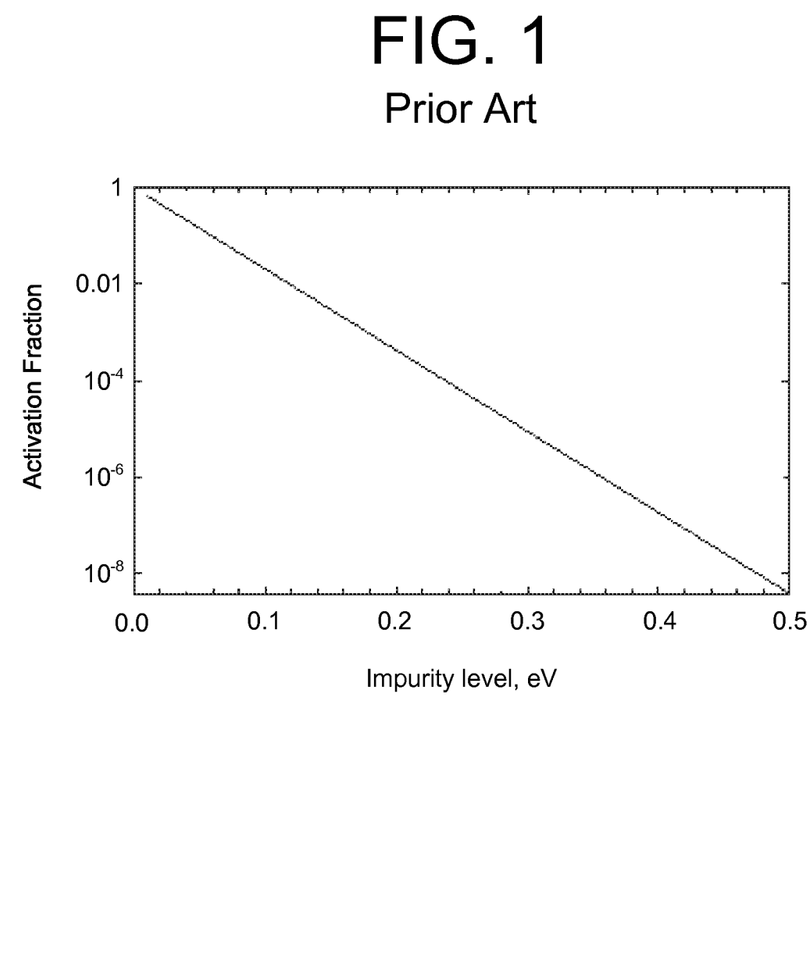
FIG. 1 shows an illustrative fraction of activated impurities as a function of the impurity level in AlGaN as shown in the prior art.

Controlling doping during the manufacture of many types of devices fabricated with wide band gap semiconductor materials is difficult. In particular, impurity levels for wide band gap semiconductor materials are deep and the activation of the impurities is inefficient, thereby making the doping more difficult to control. For example, FIG. 1 shows an illustrative fraction of activated impurities (Magnesium (Mg)) at 300 Kelvin (K) as a function of the impurity level in Aluminum Gallium Nitride (AlGaN) as shown in the prior art. As illustrated, for a Mg acceptor level in AlGaN of approximately 0.1 electron Volts (eV) above the ceiling of the valence band, only approximately one percent of the impurities are activated and supplying free holes. As a result, the conductivity of p-type AlGaN is severely limited, which is extremely detrimental to the performance of deep ultraviolet light emitting diodes (LEDs).

Polarization doping in GaN-on-AlGaN heterostructures has been shown to lead to the creation of a hole accumulation layer. For example, the polarization charge has been shown to induce a hole sheet density as high as $5 \times 10^{13}$ cm$^{-2}$ at an AlGaN/GaN heterointerface. The transition from a three-dimensional to a two-dimensional hole gas is achieved for hole sheet densities on the order of $10^{13}$ cm$^{-2}$ or higher. At lower hole sheet densities, only a three-dimensional hole accumulation layer may exist. This suggests that a two-dimensional hole gas induced by the polarization charge can be used to reduce the base spreading resistance in AlGaN/GaN-based heterostructure bipolar transistors and/or for p-channel group III nitride-based high electron mobility transistors (HEMTs).

Figure 2:
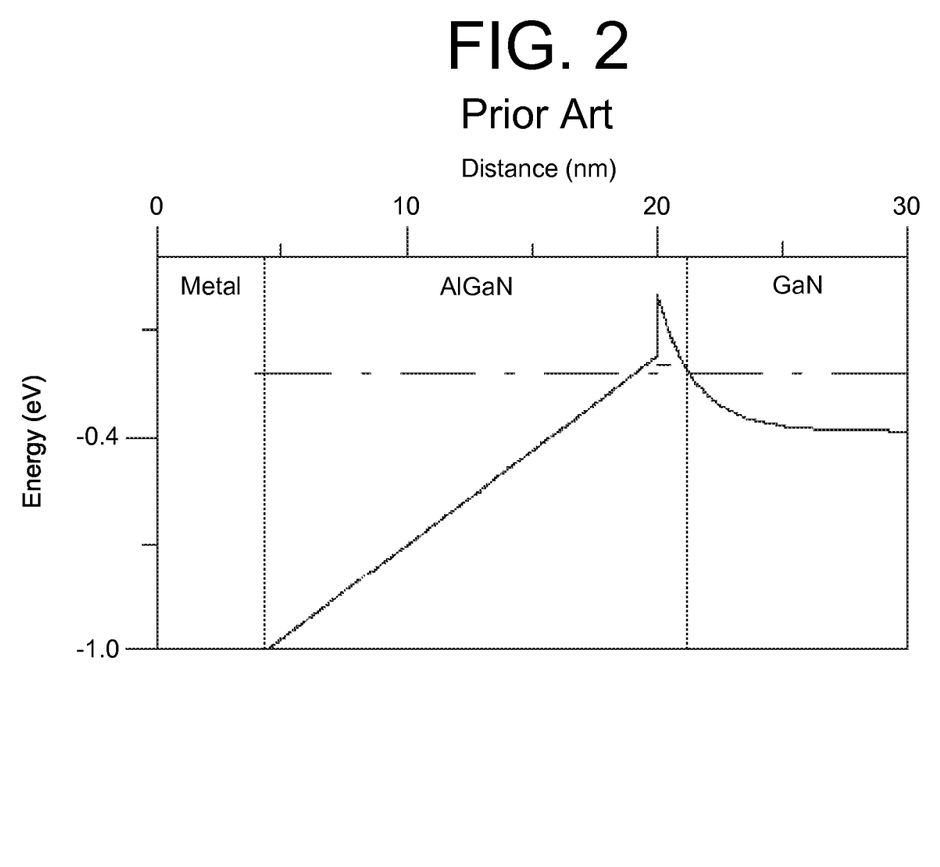
FIG. 2 shows an illustrative band diagram of a metal/AlGaN/GaN n-polar heterostructure as shown in the prior art.

FIG. 2 shows an illustrative band diagram of a metal/AlGaN/GaN heterostructure as shown in the prior art. In this case, the top GaN surface of the heterostructure comprises a nitrogen-terminated surface. In FIG. 2, the calculated two-dimensional charge density distribution includes piezoelectric and spontaneous polarization charges, a metal surface charge, and an accumulation hole charge for the heterostructure. The AlGaN layer comprises an Al molar fraction of approximately 0.25, and does not include donors. The GaN layer comprises an acceptor concentration, $N_a = 10^{17}$ cm$^{-3}$. The horizontal dashed line of FIG. 2 shows the Fermi level, and the holes occupy the energy states above this level. The two-dimensional hole gas provides a large lateral conductivity. However, as illustrated by FIG. 2, the conductance in a direction perpendicular to the two-dimensional hole gas is extremely small. The perpendicular conductance for the heterostructure is limited by the undoped or depleted wide band gap semiconductor layer, e.g., the AlGaN layer.

SUMMARY

Aspects of the invention provide a solution for designing and/or fabricating a structure including a quantum well and an adjacent barrier. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. The quantum well and the adjacent barrier can be formed such that the actual band discontinuity corresponds to the target band discontinuity.

A first aspect of the invention provides a method of fabricating a structure, the method comprising: selecting a target valence band discontinuity between a quantum well and an adjacent barrier in the structure, wherein a dopant energy level of a dopant in the adjacent barrier coincides with at least one of: a valence energy band edge for the quantum well or a ground state energy for free carriers in a valence energy band for the quantum well; and forming the quantum well and the adjacent barrier in the structure having an actual valence band discontinuity corresponding to the target valence band discontinuity, wherein the forming includes doping the quantum well and the adjacent barrier with the dopant.

A second aspect of the invention provides a method of fabricating a device, the method comprising: fabricating a structure for the device, the structure including at least one of: a heterostructure or a superlattice layer comprising a quantum well and an adjacent barrier, the fabricating the structure including: selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well; and forming the quantum well and the adjacent barrier in the structure having an actual valence band discontinuity corresponding to the target valence band discontinuity, wherein the forming includes doping the quantum well and the adjacent barrier with the dopant.

A third aspect of the invention provides a method comprising: designing at least one of: a heterostructure or a superlattice layer for a device comprising a quantum well and an adjacent barrier, the designing including: selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION

As indicated above, aspects of the invention provide a solution for designing and/or fabricating a structure including a quantum well and an adjacent barrier. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. The quantum well and the adjacent barrier can be formed such that the actual band discontinuity corresponds to the target band discontinuity. The resulting structure can provide a lower activation energy for the dopant in the barrier, which can result from a more efficient real space transfer of holes from the dopant (e.g., acceptor) energy level in the barrier into the adjacent quantum well during operation of a corresponding device. As used herein, unless otherwise noted, the term "set" means one or more (i.e., at least one) and the phrase "any solution" means any now known or later developed solution.

Figure 3A:
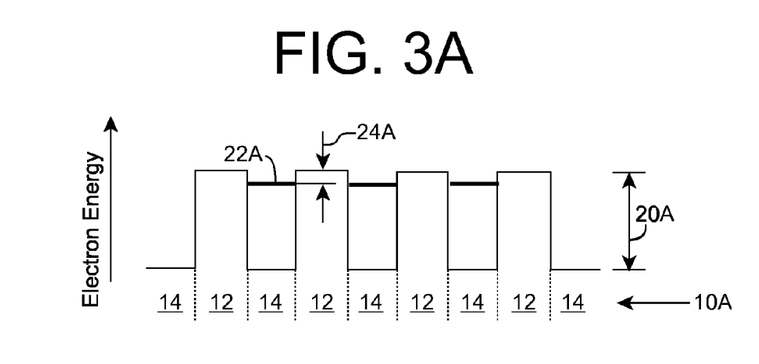
FIGS. 3A and 3B show valence band diagrams of illustrative superlattice layers according to an embodiment.
Figure 3B:
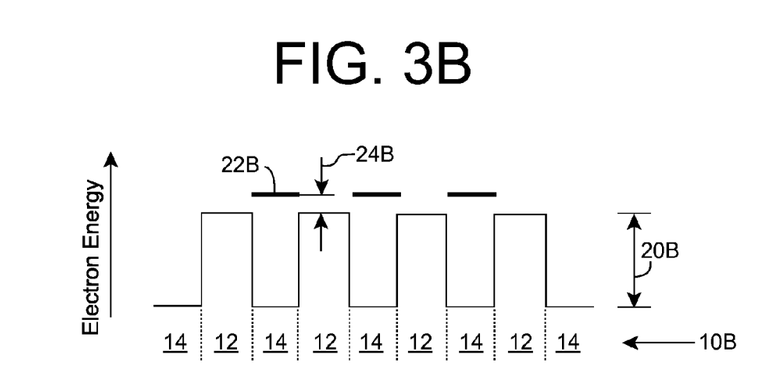

Turning to the drawings, FIGS. 3A and 3B show valence band diagrams of illustrative superlattice layers 10A, 10B, respectively, according to an embodiment. Each superlattice layer 10A, 10B includes interlaced sets of barriers 14 and quantum wells 12. To this extent, each quantum well 12 in the superlattice layers 10A, 10B has one or more adjacent barriers 14 and each barrier 14 in the superlattice layers 10A, 10B has one or more adjacent quantum wells 12.

The barriers 14 and quantum wells 12 in the superlattice layers 10A, 10B are formed using different material compositions. While superlattice layers 10A, 10B are shown having p-type barriers 14 and quantum wells 12, it is understood that barriers 14 and quantum wells 12 can comprise an n-type or a p-type composition depending on the desired functionality of the superlattice layer 10A, 10B in the structure/device. In an illustrative embodiment, the barriers 14 and quantum wells 12 are formed using differing wide band gap semiconductor materials, such as differing group III nitride material compositions. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. In a more specific illustrative embodiment, each barrier 14 comprises an aluminum gallium nitride (AlGaN) composition comprising a molar fraction of aluminum that can be expressed as $Al_x Ga_{1-x} N$, and each quantum well 12 comprises an AlGaN composition comprising a molar fraction of aluminum that can be expressed as $Al_y Ga_{1-y} N$. In a still more specific illustrative embodiment, each quantum well 12 and barrier 14 comprises a large aluminum molar fraction. Regardless, the differing compositions of the barriers 14 and quantum wells 12 in the superlattice layers 10A, 10B form a series of valence band discontinuities 20A, 20B between each adjacent barrier 14 and quantum well 12 pair in the superlattice layers 10A, 10B, respectively.

Additionally, each quantum well 12 and/or barrier 14 can be doped with a dopant during its formation. The dopant can be selected based on the material composition of the quantum well 12 and/or barrier 14 and the desired functionality to be provided by adding the dopant. For example, a different dopant can be selected based on whether the material composition is a p-type or an n-type composition. In an illustrative embodiment, the dopant is selected to add acceptor atoms to a p-type quantum well 12 and/or barrier 14 to form p-type regions within the quantum well 12 and/or barrier 14. The acceptor atoms in the barrier 14 create a corresponding acceptor level 22A, 22B of energy within the barrier 14. Illustrative dopants for p-type group III nitride materials include magnesium (Mg) and beryllium (Be), while illustrative dopants for n-type group III nitride materials comprise silicon (Si), carbon (C) on Ga site, oxygen (O) on N site and nitrogen vacancy ($V_N^{3+}$).

An effective activation energy 24A, 24B for the dopant in the barrier 14 comprises a difference between the acceptor level 22A, 22B, respectively, within the barrier 14 and an energy band edge at a top of the valence band of the adjacent quantum well(s) 12. In an embodiment, a target band discontinuity for the superlattice layers 10A, 10B is selected to coincide (e.g., align or substantially align) with the activation energy of the dopant for the quantum well 12. For example, a target valence band discontinuity 20A, 20B can be selected such that the acceptor level 22A, 22B, respectively, in the barrier 14 coincides with a valence energy band edge for the adjacent quantum well 12.

The target valence band discontinuity 20A, 20B can be obtained, for example, by adjusting a molar fraction of one or more elements in each of the quantum well 12 and the barrier 14 according to the target valence band discontinuity. To this extent, for the embodiment in which each barrier 14 comprises $Al_x Ga_{1-x} N$ and each quantum well comprises $Al_y Ga_{1-y} N$, a difference in the molar fractions of aluminum (y−x) can be selected to provide the target valence band discontinuity 20A, 20B. As a result, the effective activation energy 24A, 24B (e.g., the activation energy for the transition from the acceptor level in the barrier to the quantum well) of the dopant (e.g., acceptor) is substantially reduced over previous approaches. FIG. 3A illustrates a positive activation energy 24A, while FIG. 3B illustrates a negative activation energy 24B. In an illustrative embodiment, the activation energy 24A, 24B is close to the top of the quantum well 12, making the dopant energy level "in resonance" with the energy band edge in the wide band gap semiconductor (e.g., the barrier 14). In a more specific illustrative embodiment, the valence energy band edge for the quantum well 12 and the dopant energy levels 22A, 22B are within (i.e., less than or equal to) approximately three thermal energies (i.e., within a thermal energy of 3 kT≈0.078 eV at room temperature).

Figure 4:
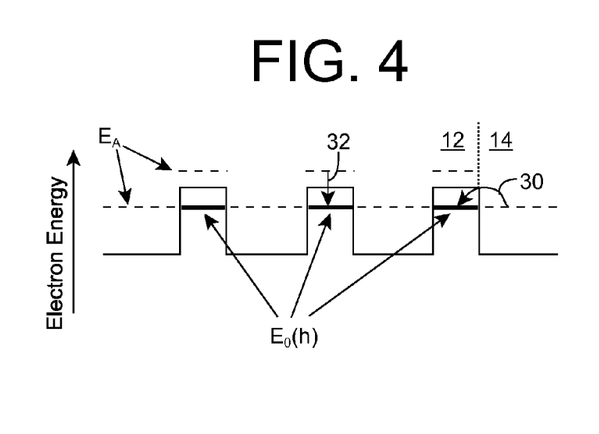
FIG. 4 shows an illustrative valence band diagram illustrating the real space transfer of holes from a barrier into an adjacent quantum well according to an embodiment.

A low effective activation energy 24A, 24B of the dopant in the barriers 14 can enable a more efficient real space transfer of holes from the dopant (e.g., acceptor) energy levels in the barriers 14 into the adjacent quantum wells 12 during operation of a device including a superlattice layer 10A, 10B, respectively. To this extent, a target valence band discontinuity 20A, 20B can be selected such that the acceptor level 22A, 22B, respectively, in the barrier 14 coincides with a ground state energy for free carriers in a valence energy band for the quantum well 12. For example, FIG. 4 shows an illustrative valence band diagram illustrating the real space transfer 30 of holes from a barrier 14 into an adjacent quantum well 12 according to an embodiment. Holes also can move from a quantum well 12 into an adjacent barrier 14 along the same direction. As illustrated in FIG. 4, an acceptor level energy position, $E_A$, in the barrier 14 is substantially aligned with a ground state energy level, $E_0(h)$, of free carriers within the quantum well 12, making the real space transfer 30 easier to achieve. For example, the real space transfer 30 can result from a positive activation energy 24A as shown in FIG. 3A, which can be less than the thermal activation energy required to trigger thermionic emission 32 of holes within a quantum well 12.

Returning to FIGS. 3A and 3B, the formation of the barriers 14 and the quantum wells 12 of the superlattice layers 10A, 10B can be further configured to enhance conductivity of the superlattice layers 10A, 10B and/or increase an effective level of the quantum well 12 and/or barrier 14 doping. In an embodiment, a target thickness of each of the barriers 14 and the quantum wells 12 can be selected to be less than a characteristic size of an impurity wave function. It is understood that a thickness of a barrier/quantum well comprises the distance between the barrier(s)/quantum well(s) immediately adjacent to the barrier/quantum well in a direction perpendicular to the flow of current across the barrier/quantum well.

Figure 5:
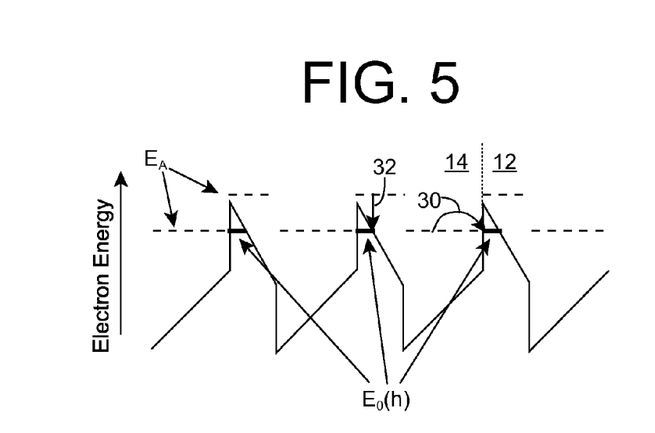
FIG. 5 shows an illustrative valence band diagram, which accounts for the affect of polarization charges, according to an embodiment.

Polarization charges can significantly change the illustrative band diagrams shown herein. To this extent, FIG. 5 shows an illustrative valence band diagram, which accounts for the affect of polarization charges, according to an embodiment. As illustrated, the real space transfer 30 can more readily occur for thin barriers 14 and quantum wells 12.

The target thickness can be selected based on an estimate of the characteristic size of the impurity wave function. In an embodiment, for a shallow impurity, the characteristic size of the impurity wave function is estimated using the Bohr radius constant. In another embodiment, for a deep impurity, the target thickness can be selected to be even smaller than the target thickness for shallow impurities. For example, the target thickness can be in a range between a single monolayer and the Bohr radius constant. In any event, each quantum well 12 and barrier 14 can be formed (e.g., grown) with an actual thickness substantially equal to the target thickness.

The superlattice layers 10A, 10B shown and described herein can be implemented as part of a structure for various types of devices. In particular, the superlattice layers 10A, 10B can be utilized to create a layer in a device structure where a very high hole/electron density is desired. Various types of devices implemented with wide band gap structures, such as group III nitrides, can include a superlattice layer 10A, 10B fabricated as described herein as one or more of: a contact layer, an intermediate layer, an active layer, and/or the like. For example, a device can comprise one or more ohmic contacts, which incorporates a superlattice layer 10A, 10B shown and described herein as a contact layer. Similarly, various group III nitride-based devices, such as a light emitting diode (LED), a superluminescent diode, a laser, a photodetector, a Schottky diode, and/or the like, can incorporate a superlattice layer 10A, 10B as shown and described herein as an intermediate layer. Still further, additional group III nitride-based devices, such as a heterostructure field effect transistor, a bipolar junction transistor, a switch, a radio frequency switch, and/or the like, can incorporate a superlattice layer 10A, 10B as shown and described herein as an intermediate layer. While shown and described herein with respect to the fabrication of a superlattice layer, it is understood that an embodiment of the invention can be applied to the fabrication of a heterostructure comprising a set of quantum wells and a set of barriers.

Figure 6A:
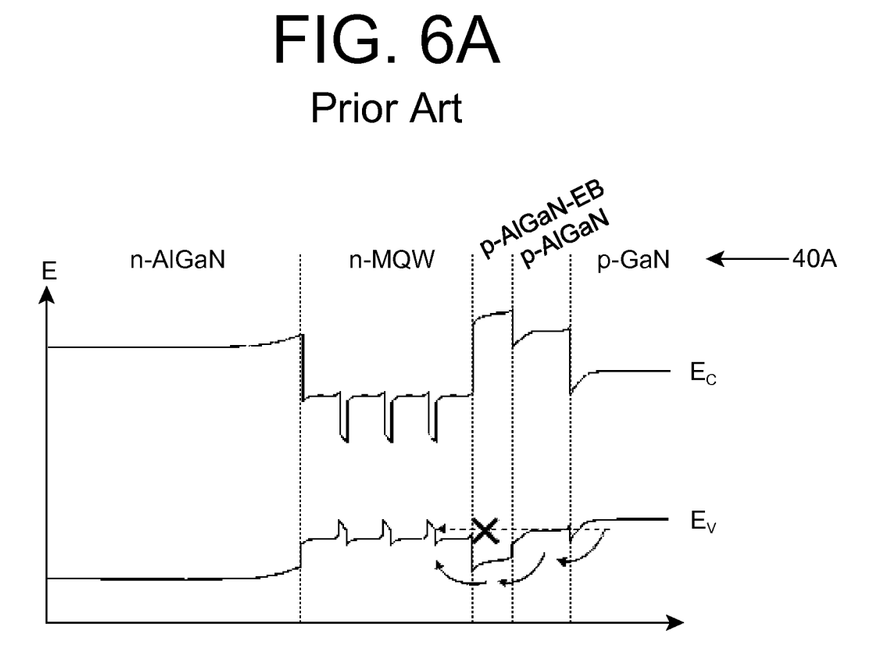
FIGS. 6A and 6B show illustrative band diagrams illustrating injection during operation of a device according to the prior art and a device according to an embodiment, respectively.
Figure 6B:
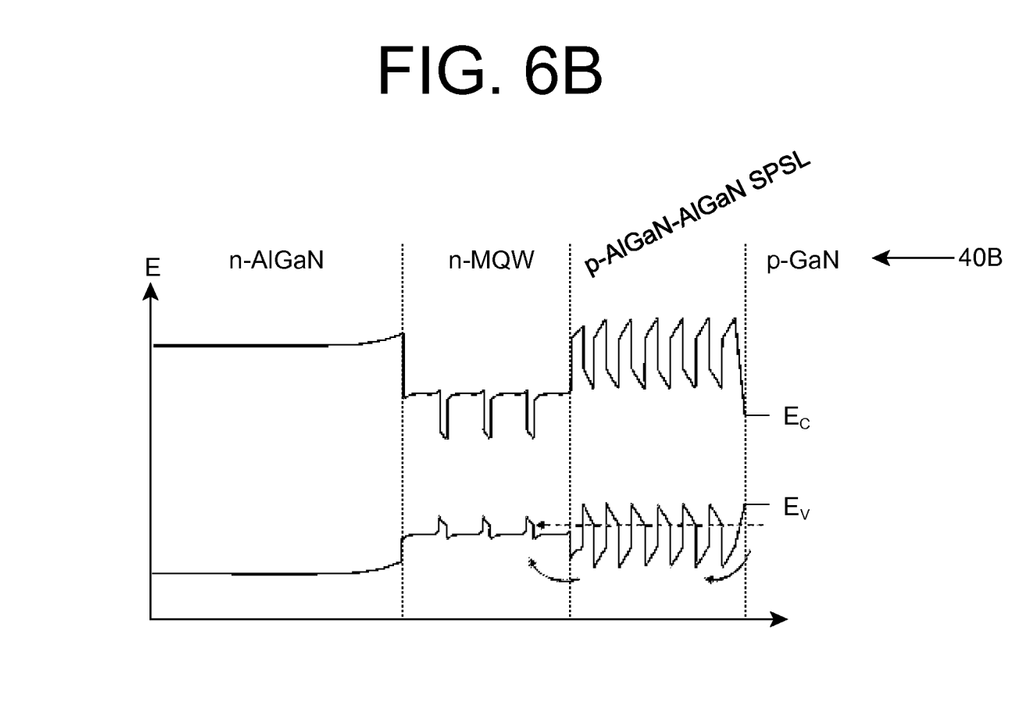

In an embodiment, a deep ultraviolet (UV) light emitting diode (LED) includes an intermediate superlattice layer 10A, 10B having extremely thin barriers 14 and quantum wells 12, which enable the injection of holes via a resonant tunneling mechanism during operation of the deep UV LED. For example, FIGS. 6A and 6B show illustrative band diagrams illustrating injection into an active multiple quantum well (MQW) structure during operation of a device 40A according to the prior art and a device 40B according to an embodiment, respectively. Both devices 40A, 40B are configured to operate as a deep UV LED. In FIG. 6A, the deep UV LED 40A comprises a standard n-AlGaN/n-MQW/p-AlGaN-EB/p-AlGaN/p-GaN structure. As illustrated in FIG. 6A, injection into the multiple quantum well (MQW) structure occurs only via thermionic emission (indicated by solid line arrows) from the adjacent electron blocking (EB) layer. In contrast, the deep UV LED 40B of FIG. 6B comprises a n-AlGaN/n-MQW/p-AlGaN-AlGaN SPSL/p-GaN structure. As illustrated in FIG. 6B, injection into the MQW structure occurs by both thermionic emission (indicated by solid line arrows) as well as resonant tunneling (indicated by dashed line arrow) from the adjacent short period superlattice layer (SPSL) according to an embodiment.

While shown and described herein as a method of designing and/or fabricating a structure and/or a corresponding semiconductor device including the structure, it is understood that aspects of the invention further provide various alternative embodiments. For example, in one embodiment, the invention provides a method of designing and/or fabricating a circuit that includes one or more of the semiconductor devices designed and fabricated as described herein (e.g., including one or more superlattice layers 10A, 10B).

Figure 7:
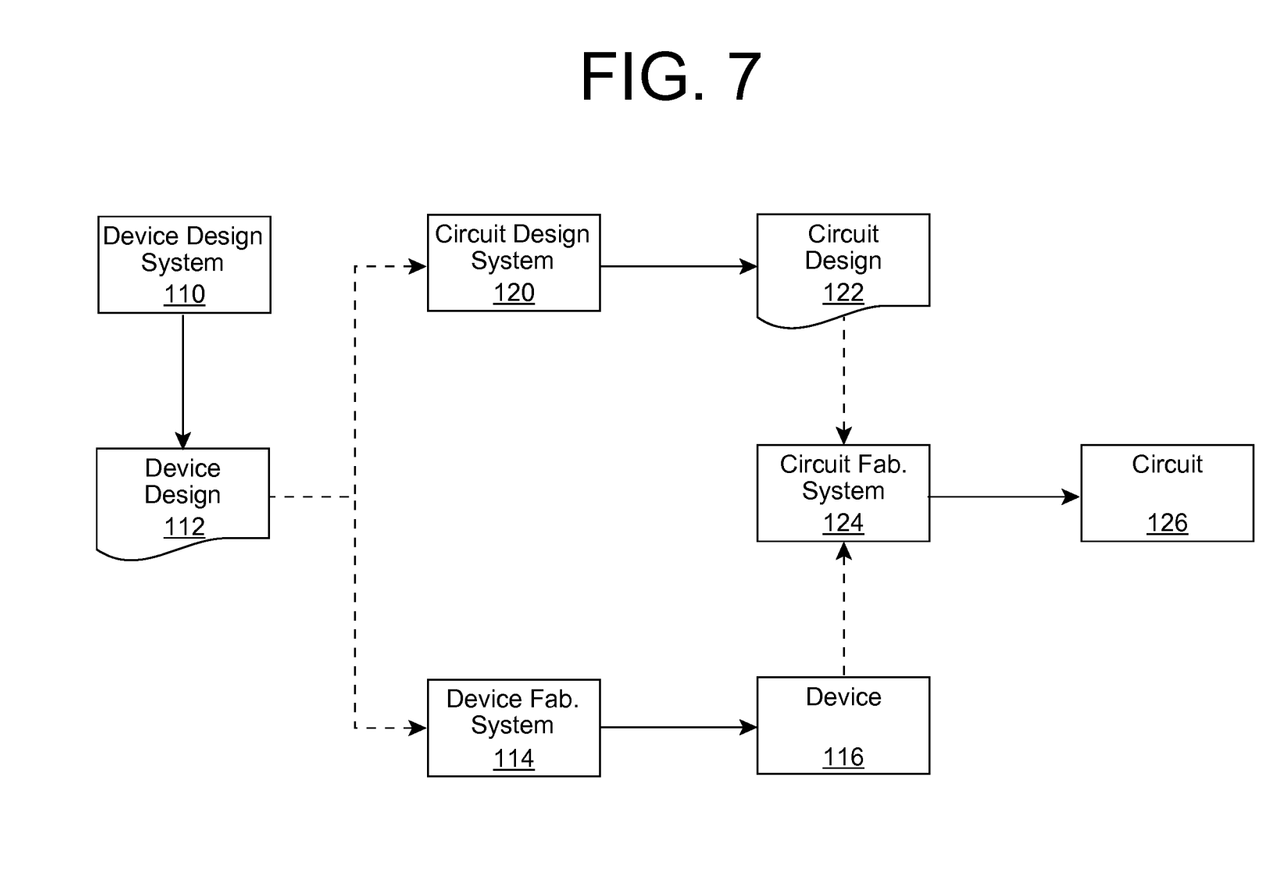
FIG. 7 shows an illustrative flow diagram for fabricating a circuit according to an embodiment.

To this extent, FIG. 7 shows an illustrative flow diagram for fabricating a circuit 126 according to an embodiment. Initially, a user can utilize a device design system 110 to generate a device design 112 using a method described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by using a method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a structure, the method comprising:
    selecting a target valence band discontinuity between a quantum well and an adjacent barrier in the structure, wherein a dopant energy level of a dopant in the adjacent barrier coincides with at least one of: a valence energy band edge for the quantum well or a ground state energy for free carriers in a valence energy band for the quantum well; and
    forming the quantum well and the adjacent barrier in the structure having an actual valence band discontinuity corresponding to the target valence band discontinuity, wherein the forming includes doping the quantum well and the adjacent barrier with the dopant.

2. The method of claim 1, wherein the forming further includes adjusting a molar fraction of at least one element in each of the quantum well and the adjacent barrier according to the target valence band discontinuity.

3. The method of claim 2, wherein each of the quantum well and the adjacent barrier comprises a group III nitride layer, and wherein the molar fraction of at least one group III element in the group III nitride layer is adjusted according to the target valence band discontinuity.

4. The method of claim 1, wherein the forming includes limiting a thickness of each of the quantum well and the adjacent barrier equal to or less than an estimated characteristic size of an impurity wave function.

5. The method of claim 4, wherein the dopant comprises a shallow impurity, the method further comprising estimating the characteristic size of the impurity wave function using the Bohr radius constant.

6. The method of claim 4, wherein the dopant comprises a deep impurity, and wherein the thickness of each of the quantum well and the adjacent barrier is in a range between a single monolayer and the Bohr radius constant.

7. The method of claim 1, wherein the valence energy band edge for the quantum well and the dopant energy level are within approximately three thermal energies.

8. The method of claim 1, wherein the selecting and forming are performed as part of fabricating a superlattice layer of the structure.

9. The method of claim 8, wherein the fabricating the superlattice layer of the structure is performed as part of fabricating an ohmic contact of the structure.

10. A method of fabricating a device, the method comprising:
    fabricating a structure for the device, the structure including at least one of: a heterostructure or a superlattice layer comprising a quantum well and an adjacent barrier, the fabricating the structure including:
        selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well; and
        forming the quantum well and the adjacent barrier in the structure having an actual valence band discontinuity corresponding to the target valence band discontinuity, wherein the forming includes doping the quantum well and the adjacent barrier with the dopant.

11. The method of claim 10, wherein the device is one of: a light emitting diode, a superluminescent diode, a laser, a photodetector, or a Schottky diode.

12. The method of claim 10, wherein the device is one of: a heterostructure field effect transistor, a bipolar junction transistor, a switch, or a radio frequency switch.

13. The method of claim 10, wherein the structure comprises one of: an intermediate layer or a contact layer for the device.

14. The method of claim 10, wherein each of the quantum well and the adjacent barrier comprises a group III nitride layer, and wherein the forming further includes adjusting a molar fraction of at least one group III element in each of the quantum well and the adjacent barrier according to the target valence band discontinuity.

15. The method of claim 14, wherein the at least one group III element is aluminum.

16. A method comprising:
designing at least one of: a heterostructure or a superlattice layer for a device comprising a quantum well and an adjacent barrier, the designing including: selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well.

17. The method of claim 16, further comprising fabricating the device, the fabricating including fabricating the structure by forming the quantum well and the adjacent barrier in the structure having an actual valence band discontinuity corresponding to the target valence band discontinuity, wherein the forming includes doping the quantum well and the adjacent barrier with the dopant.

18. The method of claim 17, further comprising fabricating a circuit, wherein the fabricating the circuit includes connecting at least one input and at least one output to the device.

19. The method of claim 18, further comprising operating the circuit.

20. The method of claim 16, further comprising creating a circuit design, wherein the creating includes connecting at least one input and at least one output to the device.

* * * * *